United States Patent [19]

Huber et al.

[11] Patent Number: 5,455,775

[45] Date of Patent: Oct. 3, 1995

[54] COMPUTER DESIGN SYSTEM FOR MAPPING A LOGICAL HIERARCHY INTO A PHYSICAL HIERARCHY

[75] Inventors: Gary D. Huber, Pleasant Valley; Harry Lichaa; Romuald Magryta, both of Poughkeepsie, all of N.Y.

[73] Assignee: International Business Machines Corporation, Armonk, N.Y.

[21] Appl. No.: 9,484

[22] Filed: Jan. 25, 1993

[51] Int. Cl.[6] .............................. H01L 21/82; H01L 25/00
[52] U.S. Cl. .................. 364/488; 364/489; 364/490; 364/578; 361/729; 361/699; 361/683
[58] Field of Search .................................. 364/488, 489, 364/490, 491, 578, 402, 800; 395/500, 600, 900, 115; 361/393, 380, 385

[56] References Cited

U.S. PATENT DOCUMENTS

| | | | |
|---|---|---|---|
| 3,840,863 | 10/1974 | Fuqua et al. | 395/600 |
| 4,479,196 | 10/1984 | Ferrer et al. | 395/600 |
| 4,593,351 | 6/1986 | Hong et al. | 395/800 |
| 4,646,229 | 2/1987 | Boyle | 395/600 |
| 4,942,541 | 7/1990 | Hoel et al. | 395/115 |
| 5,067,091 | 11/1991 | Nakazawa | 364/490 |
| 5,140,526 | 8/1992 | McDermith et al. | 364/488 |
| 5,150,279 | 9/1992 | Collins et al. | 395/800 |
| 5,222,030 | 6/1993 | Dangelo et al. | 364/489 |
| 5,245,550 | 9/1993 | Miki et al. | 364/489 |
| 5,262,959 | 11/1993 | Chkoreff | 364/489 |

OTHER PUBLICATIONS

Partitioning and Placement Technique for CMOS Gate Arrays Odawara et al., IEEE 1987.
Chortle: A Technology Mapping Program for Lookup Table-Based Field Programmable Gate Arrays, Francis et al, IEEE 1990.
Dagon: Technology Binding and Local Optimization by DAG Matching Keutzer, IEEE 1987.
Technology Mapping of Digital Circuits de Micheli, IEEE 1991.
Timing Optimization on Mapped Circuits Yoshikawa, IEEE 1991.

*Primary Examiner*—Kevin J. Teska
*Assistant Examiner*—Jacques H. Louis-Jacques
*Attorney, Agent, or Firm*—Lawrence D. Cutter; Wayne F. Reinke

[57] ABSTRACT

A computer design system is used to map a logical hierarchy corresponding to the logical functions of an electronic system into a physical hierarchy corresponding to the physical positioning of the actual electronic components which will implement the logical functions of the system. The logical hierarchy contains several levels of logical entities connected by signals, and the physical hierarchy contains physical packages corresponding to electronic components, such as integrated circuits. The mapping is accomplished by designating partition group assertions (PGAs) for each of the logical entities in the logical hierarchy. Each PGA corresponds to one of the physical packages in the physical hierarchy. Each entity is grouped by common PGA designation, and each signal of each entity is classified as external, if the signal connects entities located on different physical packages, or internal, if the signal connects entities located on the same physical package. The physical hierarchy for the electronic system is generated using lists of these logical entity groupings and signal classifications. An advantage of the present invention is that partitioning of a logical design into a physical design is done automatically.

21 Claims, 8 Drawing Sheets fig. 1 fig. 2

COMPUTER DESIGN SYSTEM FOR MAPPING A LOGICAL HIERARCHY INTO A PHYSICAL HIERARCHY

FIELD OF THE INVENTION

The present invention relates generally to a computer system for electronic design and, in particular, to a computer design system that supports the mapping of a logical hierarchy corresponding to the logical functions of an electronic system into a physical hierarchy corresponding to the physical partitioning of the actual electronic components, such as integrated circuits, which will implement the functions of the system's logical design in the final manufactured product.

DESCRIPTION OF THE PRIOR ART

Large electronic system design often involves the design and layout of a system having hundreds of integrated circuits (also referred to herein as chips). Systems such as these are typically designed to implement a large number of logical functions, which are dictated by the operational requirements of the system. These functions are implemented by the logical design for the system.

When designing a large system, the logical design typically is completed first. However, in order to manufacture the actual physical structure of the system, it is necessary to convert this logical design into a physical design (also referred to as the partitioning of the physical components), which specifies the actual physical locations of the electronic components necessary to implement the logical functions represented by the logical design. For example, the physical design typically includes a list of the chips required along with the physical connections between them along with any physical connections to the external pins of the system. The logical design is converted (referred to hereinafter as mapped) into a physical design by physically allocating (referred to hereinafter as partitioning) each of the logical functions of the logical design to a specific physical component, such as a chip, that will be used in the final, manufactured system.

When mapping the logical design into a physical design, it is desirable to optimally partition the logical functions so that the physical capabilities of the electronic components to be used in the final system are fully exploited. For example, it is typically desirable to fully use the input/output pins and circuit capacity of each chip in the system while achieving the best overall cycle-time. Also, in some cases it is desirable to optimize the heat transfer from components on a circuit board (for example, thermal conduction modules) to be used in the system. In other cases, it is desirable to minimize the physical path length for certain critical signals.

The physical properties of the system that are most advantageous to optimize will vary depending upon the particular design; but regardless of the particular properties to be optimized, in order to achieve an optimum physical design, typically at least several logical-to-physical mapping iterations are required. In some cases hundreds will be required. When mapping a physical design having a large number of electronic components, the process of physically partitioning the logical functions between these components is time-consuming and tedious. A need for several mapping iterations further increases this burden.

Typically, partitioning of the logical functions and mapping of the physical design is accomplished manually. This is performed, for example, by manually removing the logical functions for different portions of a logic design and then reassembling these logical functions into a physical design, say, using a design entry system based upon physical entities such as chips. In other words, manual partitioning is the process by which a logical function is moved from one physical partition to another by manually deleting the design in the first partition and then adding it to a second partition. However, a manual approach is slow, cumbersome, and tedious. This is especially so in light of the large number of mapping iterations often required to optimize a physical system design. Further, as a system being designed becomes more complicated, the likelihood of introducing logical errors during the re-partitioning from a logical design to a physical design significantly increases. When a logical error occur during mapping, it frequently requires extensive rework of verification efforts that are performed on the logical design, such as simulation.

Thus, there is a need for a computer design system that improves the process of mapping a logical design into a physical design for large electronic systems. Further, there is a need for such a design system that is less tedious, less time-consuming, and reduces the likelihood of logical errors during partitioning and mapping of the logical design.

SUMMARY OF THE INVENTION

This need is satisfied, the limitations of the prior art overcome, and other benefits realized in accordance with the principles of the present invention by a method for designing an electronic system or device using a digital computer. According to this method, a logical hierarchy having from one to many levels and representing the logical design of the system to be built is stored in the memory of the computer. This logical hierarchy comprises logical entities, which are located amongst the different levels of the hierarchy, that correspond to the logical functions to be implemented by the electronic system. Each logical entity in the hierarchy is connected to other entities by signals that are inputs or outputs thereof.

According to the present invention, the logical hierarchy is mapped into a physical hierarchy that comprises physical packages. These packages correspond to physical components in the final electronic system, such as individual integrated circuits, portions of an integrated circuit, physical areas of a chip, physical carriers, boards, or cards. The physical hierarchy represents the physical structure of the system and indicates the physical connections between components thereof. The mapping is accomplished according to the invention by designating partition group assertions (PGAs) for each of the logical entities in the logical hierarchy. This may be done, for example, using an interactive graphics terminal and a mouse, or by a software program which makes designations based upon an analysis of various characteristics of the design. Each PGA corresponds to one of the physical packages in the physical hierarchy.

After designating PGAs for each logical entity, a first list is created and stored in memory for each PGA listing the logical entities and corresponding signals located thereon. Next, using this first list and proceeding with one physical package at a time, the signals connected to each logical entity are traced one at a time and classified as either external or internal. This classification is stored in a second list in memory. An external signal connects logical entities that are located on different physical packages and, therefore, corresponds to a physical connection that will be required in the final product. An internal signal, on the other hand, only connects logical entities located on the same physical package and, therefore, corresponds to a signal that will not require an actual physical connection between packages in the final product.

Finally, the physical hierarchy for the electronic system is generated using the first list of logical entity groupings and the second list of signal classifications. The lowest level of the generated physical hierarchy provides a representation for each physical package of all logical entities and corresponding connecting signals located thereon. This representation may be, for example, a graphical display as found on an interactive graphics terminal or a simple interconnection netlist. Higher levels of the physical hierarchy provide representations of the physical packages and the physical connections therebetween. These representations may be, for example, graphical displays or interconnection netlists.

In the preferred approach, the logical hierarchy is flattened following the designation of PGAs, but before tracing of the signals therein. Also, PGAs can be designated for lower-level entities by representation through higher-level entities. In other words, if a higher-level entity is designated with a PGA, then all of the lower-level entities represented by that higher-level entity will be implicitly designated with the same PGA. However, in a preferred approach, a lower-level PGA designation may be made that will override a different PGA designation made at an even higher level.

An important advantage of the present invention is that it permits the automatic generation of a physical design for an electronic system using the designations of PGAs in a logical hierarchy thereof. Thus, the present invention simplifies the mapping process and eliminates the likelihood of logical design errors during mapping. Further, the present invention readily permits the generation and comparison of physical designs for different technologies using the same logical design. Because the logical design remains unchanged during these different mappings, extensive logical re-partitioning is not required.

The foregoing and other objects, features, and advantages of the invention will be apparent from the following more particular description of a preferred embodiment of the invention, as illustrated in the accompanying drawings.

BEST MODE FOR CARRYING OUT THE INVENTION

According to the present invention, a logical hierarchy having a plurality of logical entities, both parent and primitive, and representing the logical design for an electronic system is mapped into a physical hierarchy having a plurality of physical packages and representing the physical connections between these packages. According to the present invention, the logical entities of a logical hierarchy are designated with a set of PGAs corresponding to a set of physical packages that will contain the physical circuits corresponding to the logical functions of the electronic system under design. A physical hierarchy is generated using a logical-to-physical mapping compiler that is loaded on a computer design system.

Following its compilation, the physical hierarchy is checked against a technology limits and rules file to determine whether any of the physical limits of the packages selected for the system design are violated by the physical hierarchy thus generated. If so, then PGAs are re-designated for the logical entities of the logical hierarchy in order to change the mapping of the physical hierarchy. The set of PGAs used may correspond to the same or a different set of physical packages. The new physical hierarchy thus generated is compared with the physical limits file to determine compliance. This process is repeated as required to complete the physical partitioning design for the electronic system.

COMPUTER DESIGN SYSTEM

Figure 1:
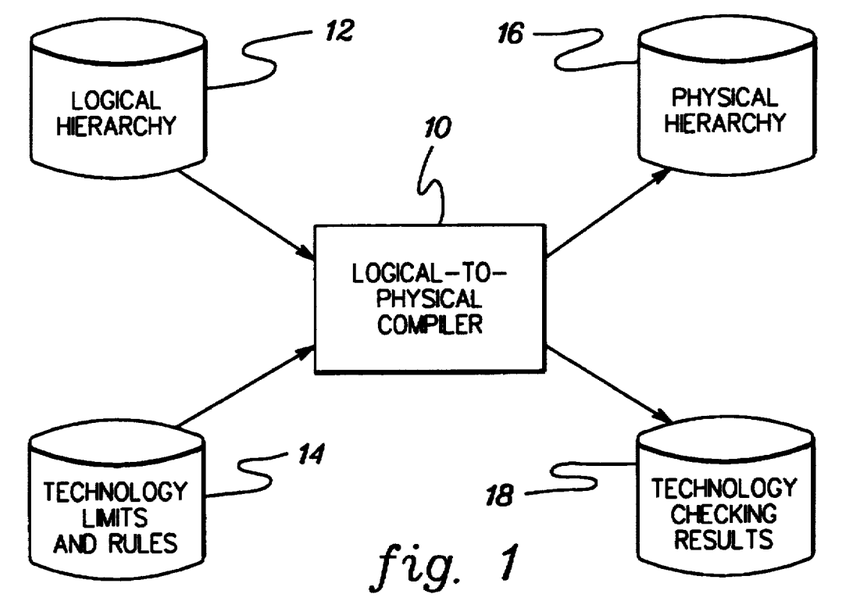
FIG. 1 illustrates a compiler, along with its corresponding inputs and outputs, used to map a physical hierarchy from a logical hierarchy according to the present invention.

FIG. 1 illustrates a mapping compiler 10, along with its corresponding inputs and outputs, used to map a physical hierarchy from a logical hierarchy according to the present invention. A logical hierarchy file 12 and a technology limits and rules file 14 are inputs to compiler 10. Logical file 12 contains a logical hierarchy having entities with previously-designated PGAs (recall that each PGA corresponds to a physical package), and technology file 14 contains physical restrictions corresponding to the physical packages to be used in a design. Examples of these restrictions include the maximum number of inputs/outputs for a package, the maximum power consumption per package, and the maximum number of circuits permissible per package. A physical hierarchy file 16 and a technology checking results file 18 are the outputs from compiler 10.

In a first step, to be described in greater detail later, mapping compiler 10 processes logical hierarchy file 12 and generates physical hierarchy file 16. In a second step, also described in greater detail later, compiler 10 compares physical hierarchy file 16 against technology limits and rules file 14 and generates technology checking results file 18, which indicates compliance, or non-compliance, with the physical requirements represented by file 14.

Figure 2:
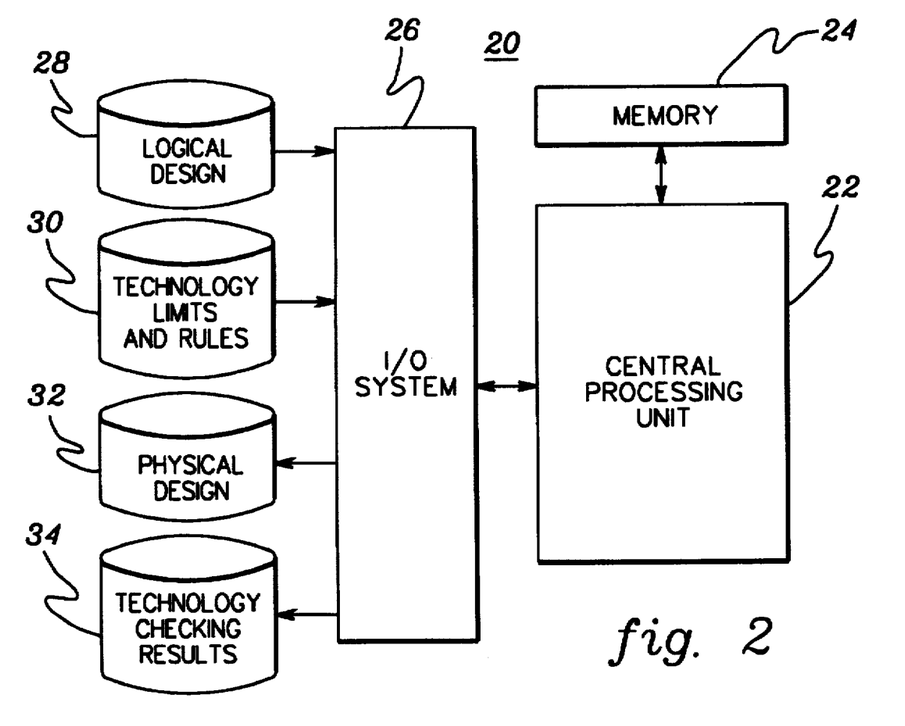
FIG. 2 is a block diagram of a computer design system that executes the logical-to-physical compiler of the present invention.
Figure 3A:
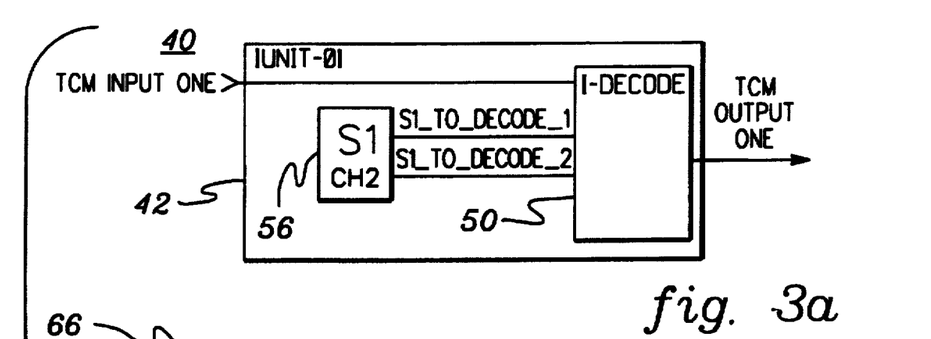
FIG. 3A–3D comprise a graphical representation of a logical hierarchy having a set of partition group assertions designated thereon in accordance with the present invention.
Figure 3B:
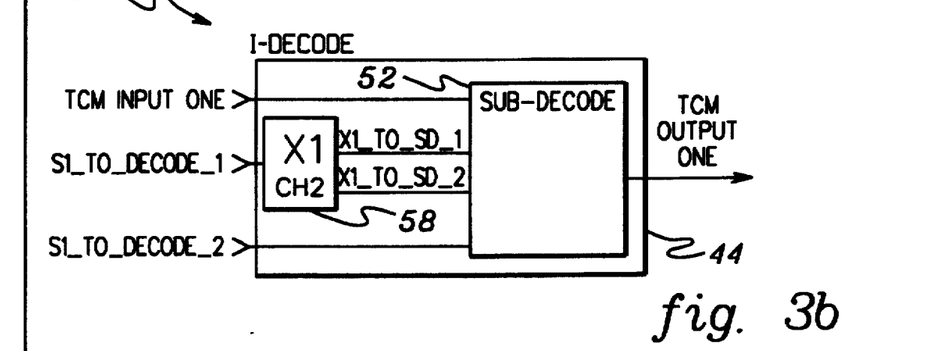
Figure 3C:
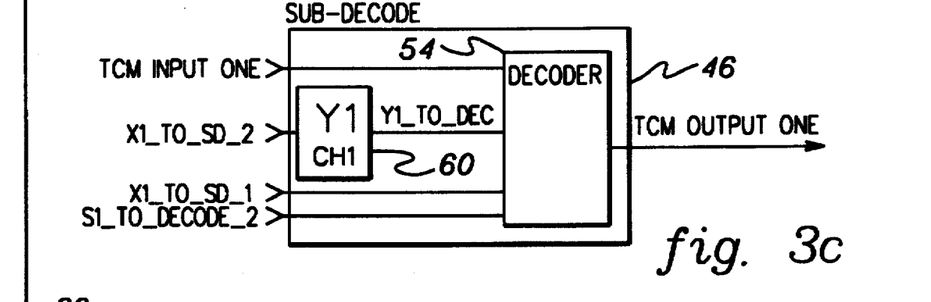
Figure 3D:
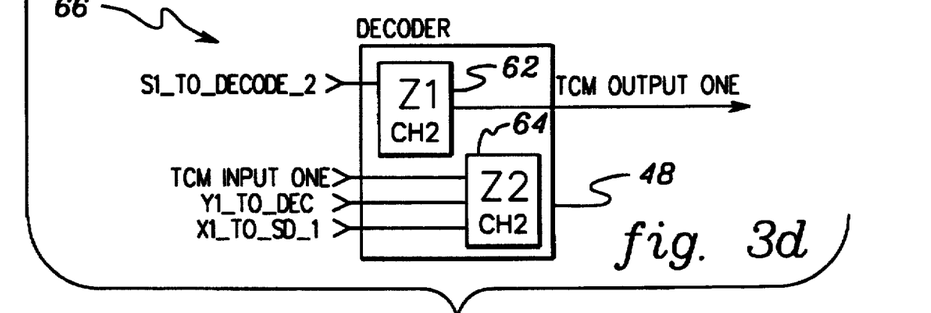

FIG. 2 is a block diagram of a computer design system 20 that executes the code for the logical-to-physical compiler described above. System 20 has a central processing unit (CPU) 22 and a main system memory 24. The mapping compiler is loaded onto main system memory 24 and executed by CPU 22. System 20 also has an input/output system 26 and physical storage devices 28, 30, 32, and 34, which are, for example, disk devices. In general, the files stored on physical storage devices 28, 30, 32, and 34 are temporarily stored in memory 24 during processing. In addition to executing the compiler code, CPU 22 initiates input/output requests to the physical storage devices and performs the calculations required during mapping.

Input/output system 26 connects CPU 22 to physical devices 28, 30, 32, and 34, and transfers data to and from CPU 22 upon request. Storage device 28 stores a logical hierarchy, and storage device 30 stores a set of technology limits and rules, both as electronic files for use as inputs to CPU 22 and which are loaded into memory 24 for processing. Similarly, storage device 32 stores a physical hierarchy, and storage device 34 stores a summary of technology checking results, both as electronic files provided as outputs by CPU 22 and are retrieved from memory 24 after processing.

An example of computer design system 20, as described above, is an ES/9000 or an RS/6000 system, both manufactured by IBM. Many other systems may also be used according to the present invention.

LOGICAL-TO-PHYSICAL HIERARCHY MAPPING

FIGS. 3A–3D comprise a graphical representation of a logical hierarchy 40 that corresponds to a logical design for an electronic system. Logical hierarchy 40 has several levels indicated by blocks 42, 44, 46, and 48 in FIGS. 3A–3D, respectively. Block 42 is positioned at the highest level, block 44 is positioned at the next lower level in the hierarchy, block 46 is positioned another level lower, and block 48 is positioned at the lowest level.

The graphical representation shown in FIGS. 3A–3D is conventional and is created, for example, by a systems designer using a schematic capture system which is usually based on a workstation. However, the particular representation for logical hierarchy 40 is not critical. Other representations will work with the present invention.

Logical hierarchy 40 contains a plurality of logical entities connected by signals. More specifically, hierarchy 40 contains parent entities 50, 52, and 54, and primitive entities 56, 58, 60, 62, and 64. These logical entities are connected by signals 66. Each one of signals 66 is given a signal name. For example, the signal connecting entity 60 to entity 54 is named "Y1_TO_DEC".

A logical entity is described as a "parent" where it represents or expands into one or more entities at a lower level in the hierarchy. For example, entity 50 is a parent because it is a higher-level representation of entities 52 and 58. Likewise, entity 52 is a parent because it expands into parent entity 54 and primitive entity 60. In contrast to parent entities, a primitive entity does not represent or expand into any lower-level entity. For example, entity 56 is a primitive entity, even though located on the highest level in the hierarchy, because it does not expand into any entity at any lower level.

According to the present invention, PGAs are designated for each entity in a logical hierarchy. PGAs can be designated for either parent or primitive entities. In the preferred embodiment, if a PGA is designated for a parent entity, then all lower-level entities represented by that parent are designated with the same PGA. The PGA designation for an entity is an attribute of that entity and is stored along with the other information about the hierarchy in the logical hierarchy file. As an example of the placement of a PGA, a PGA designation may be asserted for an entity using a conventional graphics-entry design system.

In the preferred embodiment, all primitive entities will be designated with PGAs either directly by adding PGA assertions on the entity itself or through representation by a higher-level parent entity. PGAs may also be assigned via an analysis program. However, the practice of the invention is not limited to logical hierarchies in which all primitive entities have been designated with PGAs. On the contrary, the present invention will map a logical hierarchy having less than all primitive entities designated with PGAs and will map it to the extent that the actual, completed PGA designations permit. Also, in some cases, entities can be assigned a default PGA which permits mapping with only a partial design.

With reference to FIGS. 3A–3D, as just one example of PGA designation on a logical hierarchy, a first PGA "CH1" (corresponding to chip 1) has been designated for primitive entity 60, and a second PGA "CH2" (corresponding to chip 2) has been designated for primitive entities 56, 58, 62, and 64. Each PGA corresponds to a physical package. Here, "CH1" corresponds to a physical package named chip 1, and "CH2" corresponds to a physical package named chip 2.

In other cases, the PGA for primitive entities 62 and 64 could be designated by representation through parent entity 54. In other words, parent entity 54 could be designated with a PGA for chip 2 and the logical hierarchy file would store a PGA attribute of "CH2" for primitive entities 62 and 64. Lower-level entities inherit the PGA designation of a parent during the flattening of the logical hierarchy.

After a logical hierarchy's entities have been designated with PGAs, the logical hierarchy file is processed by the logical-to-physical mapping compiler, as described in greater detail, later, to provide a physical hierarchy FIGS. 4A–4C comprise a graphical representation of a physical hierarchy 70 that has been mapped from the logical hierarchy of FIGS. 3A–3D according to the computer design system of the present invention. Physical hierarchy 70 is stored as an electronic file, and FIGS. 4A–4C comprises one example of a graphical representation of this file. In the preferred approach, FIGS. 4A–4C are displayed and edited, for example, using the same graphic design entry system used in entering the logical hierarchy.

Figures 4A, 4B:
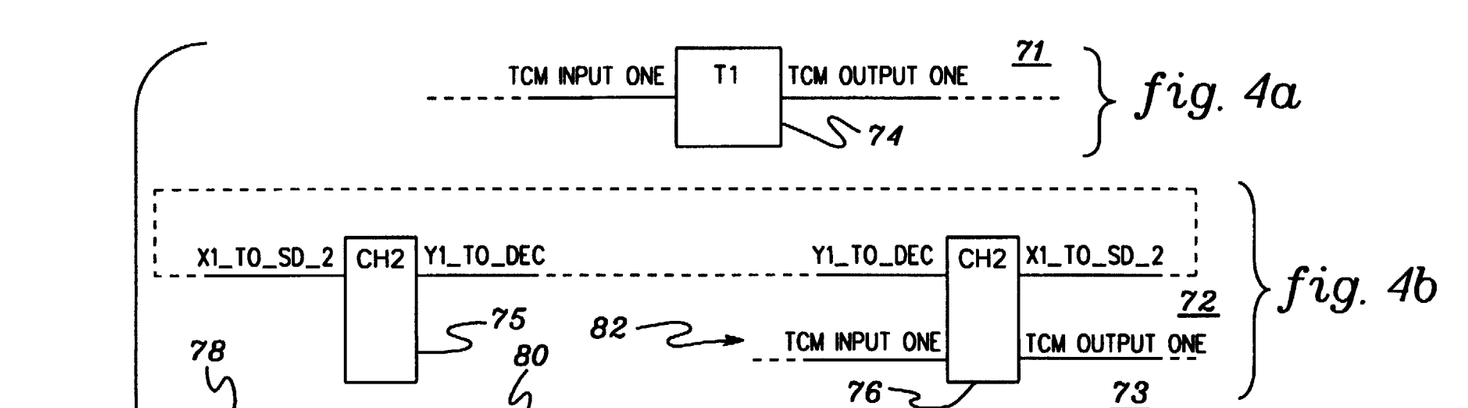
FIG. 4A–4C comprise a graphical representation of a first physical hierarchy mapped from the logical hierarchy of FIGS. 3A–3D according to the present invention.
Figure 4C:
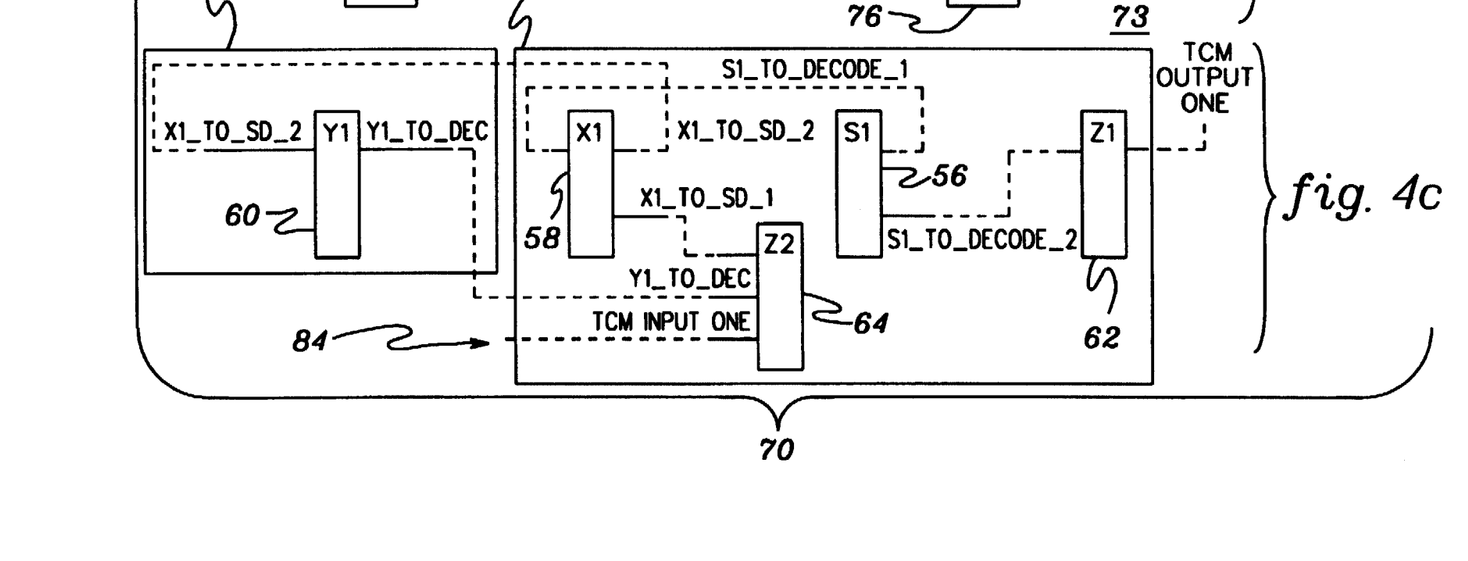

Physical hierarchy 70 has three levels: a top level 71 shown in FIG. 4A, a middle level 72 shown in FIG. 4B, and a low level 73 shown in FIG. 4C. A block 74 is positioned on top level 71 and represents physical packages 75 and 76, which are both positioned on middle level 72. Block 74 represents, for example, a system board containing physical packages 75 and 76, which are used in the physical design of the electronic system represented by logical hierarchy 40 and physical hierarchy 70. Specifically, physical package 75 is named "chip 1" and was designated in logical hierarchy 40 by PGA "CH1", and physical package 76 is named "chip 2" and was designated by PGA "CH2".

Blocks 78 and 80 are positioned on low level 73. Block 78 corresponds to physical package 75 and indicates the logical entities from logical hierarchy 40 that are implemented using circuits, such as transistors, physically located on physical package 75. Likewise, block 80 corresponds to physical package 76 and indicates the logical entities implemented using circuits located on physical package 76. As indicated by physical hierarchy 70 in FIGS. 4A–4C following its mapping by compiler 10 according to the present invention, primitive entity 60 is physically implemented on chip 1 (i.e. physical package 75), and primitive entities 56, 58, 62, and 64 are physically implemented on chip 2 (i.e. physical package 76). As described later, in the preferred embodiment, no logical parent entities are mapped into the physical hierarchy.

A plurality of signals 82, for example "Y1_TO_DEC" connect physical packages 75 and 76, and a plurality of signals 84, for example "X1_TO SD_1", connect primitive entities 56, 58, 60, 62, and 64. Each signal of signals 82 and 84 has the same name in both the logical and physical hierarchies.

According to the preferred embodiment of the present invention, following mapping by compiler 10, all signals in the logical hierarchy are classified as either external or internal. An external signal connects primitive entities that are located on different physical packages and thus corresponds to a true physical connection. Referring to FIG. 4C, an example is signal "X1_TO_SD_2" which connects primitive entity 58, located on physical package 76, to primitive entity 60, located on physical package 75. In contrast, an internal signal connects primitive entities that are located entirely within one physical package and thus does not correspond to a physical connection. Referring again to FIG. 4C, an example is signal "S1_TO_DECODE_1" which connects primitive entity 58 to primitive entity 56, both located on physical package 76.

Signals 84 of low level 73 in physical hierarchy 70 will in general comprise both external and internal signals. More specifically, an external signal will cross the boundaries of blocks 78 and 80, whereas an internal signal will not leave the boundary of either one of blocks 78 or 80. In contrast, signals 82 of middle level 72 will comprise only external signals because middle level 72 is a representation of the physical packages of a system design and the connections therebetween. Connections between physical packages are always physical. The signals of top level 71 likewise comprise only external signals that represent physical connections.

As a special case of the above classification, some signals, such as "TCM OUTPUT ONE", are classified as external simply because these signals are sinked outside of the logical model.

LOGICAL-TO-PHYSICAL MAPPING COMPILER

FIGS. 5–8 are logic flow diagrams illustrating the steps in the procedure according to the present invention for mapping a logical hierarchy into a physical hierarchy. The logic flow illustrated in FIGS. 5–8 corresponds to the program code of compiler 10 that runs on computer system 20. In one embodiment the program code is implemented in a high-level programming language such as "c" to run, for example, on either a mainframe, such as an IBM 390, or a workstation, such as the IBM RS/6000.

Figure 5:
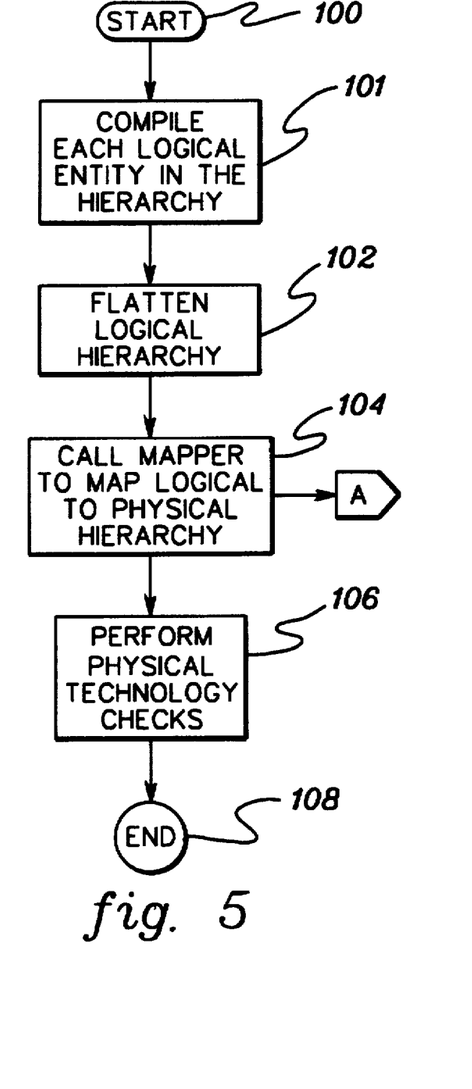
FIGS. 5–8 are logic flow diagrams illustrating the method according to the present invention for mapping a logical hierarchy into a physical hierarchy.

Referring to FIG. 5, the mapping procedure begins with step 100. At this step a logical hierarchy has been prepared, for example, using a graphic design entry system. In a preferred approach, each entity in the logical hierarchy is stored as a separate file, and thus, the logical hierarchy is a collection of files. Also, PGAs have been designated for the logical entities in the logical hierarchy. In step 101 each logical entity in the logical hierarchy file is compiled to provide memory representation of the logical entity. Following this compilation, the logical hierarchy is represented by lists of memory representations for the logical hierarchy.

In step 102, the logical hierarchy is flattened to remove all parent entities, leaving only primitive entities, and the hierarchy is represented and stored as a flat logical model in memory having only one level. The mapping process is more efficient when using a flat model representation. In step 104 a mapping subroutine, which is shown in FIG. 6, is called to map a physical hierarchy from the flattened logical hierarchy.

Figure 6:
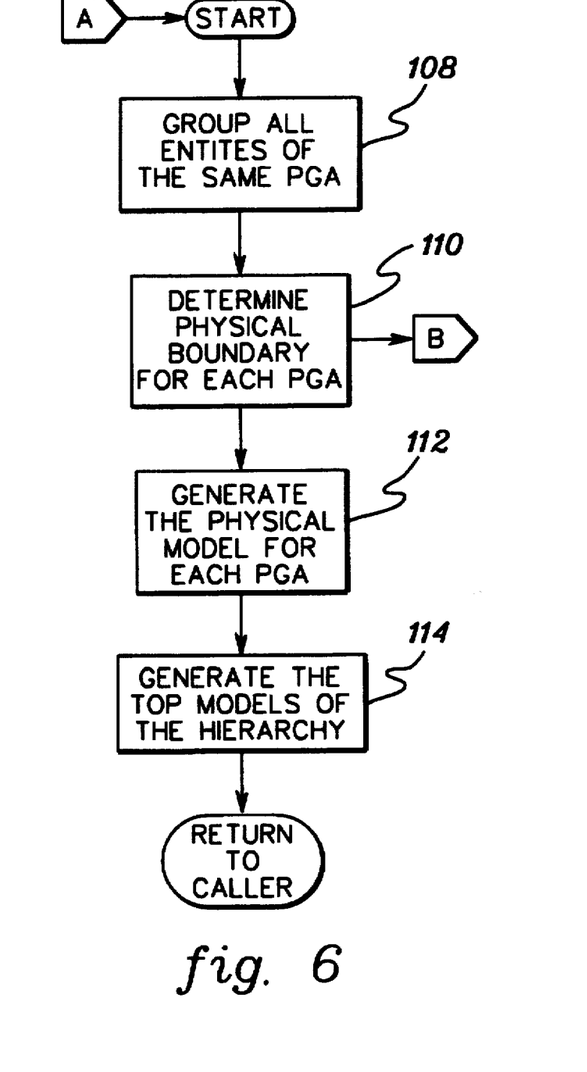

FIG. 6 illustrates the logic flow for the mapping subroutine called by step 104. In step 108 logical entities are collected into groups where each group contains entities that have been designated with the same PGA. Due to this grouping, a list is created for each physical package that indicates all of the primitive entities located thereon (as indicated by their common PGA). Each list is stored in memory and later used during the mapping procedure to create its physical representation. As an example of this grouping, with reference to FIG. 4B, one list would be created for physical package 75 (chip 1) containing entity 60, and a second list would be created for physical package 76 (chip 2) containing entities 56, 58, 62, and 64 (shown in FIG. 4C). In general, in a preferred approach, the physical hierarchy is a collection of files, with one file for each physical level.

Referring back again to FIG. 6, following step 108, step 110 calls a subroutine to determine the physical boundary for each PGA. As a part of this step, for each physical package, the signals connecting logical entities located thereon are traced and classified as either external or internal. External signals require physical connections to a different physical package while internal signals do not. Thus, determining the physical boundary for each PGA refers to determining those physical connections required for each physical package.

Figure 7:
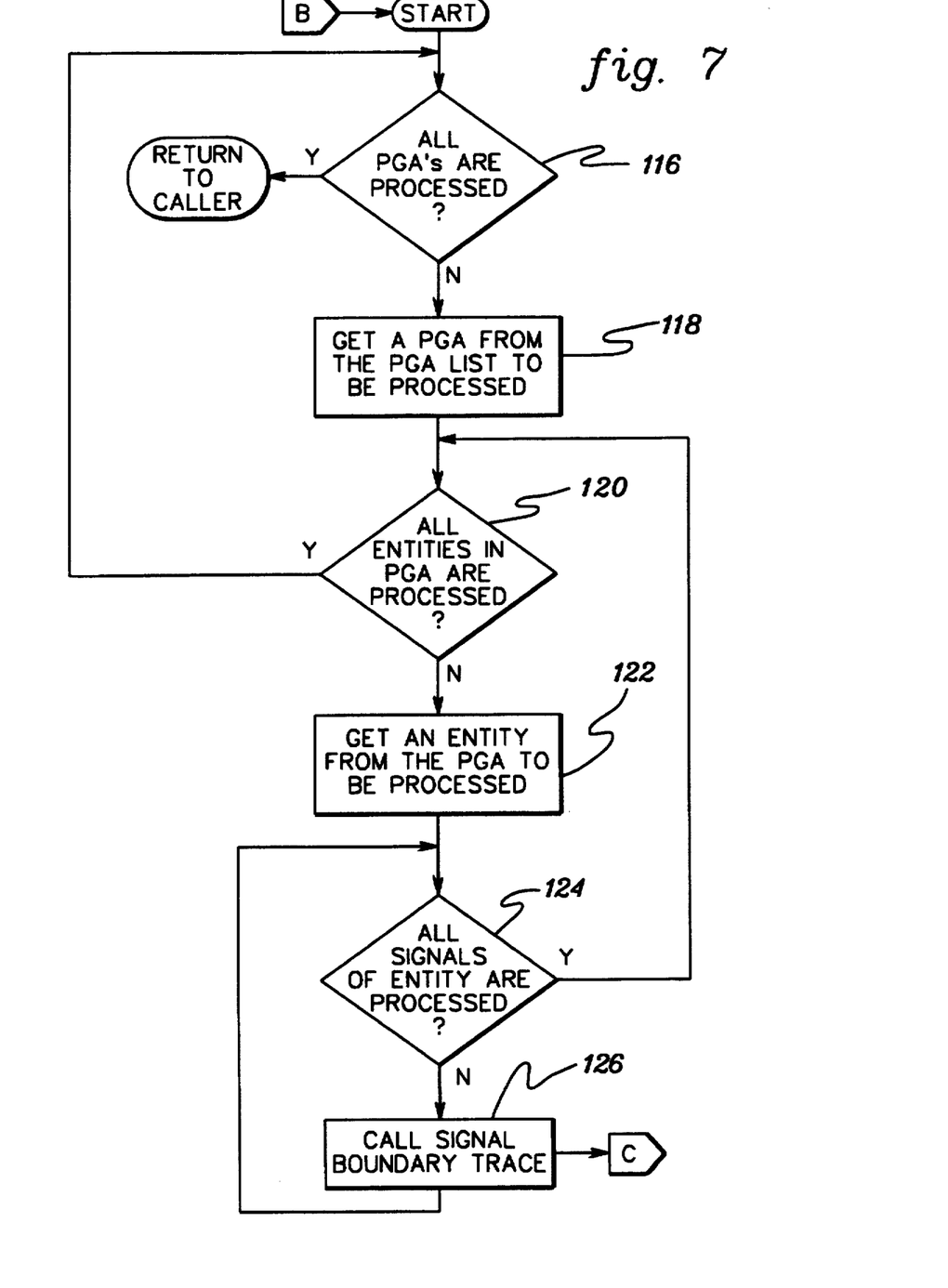

FIG. 7 illustrates the subroutine for determining a physical boundary for each PGA that is called by step 110. Each PGA is processed one at time by the subroutine in FIG. 7. In step 116, if all PGAs have already been processed, then the program returns to step 110 and proceeds to step 112. Otherwise, in step 118, a new PGA is selected from a list of PGAs for processing of the entities having this PGA designation. In step 120, if all entities common to this PGA have been processed, then the program branches to step 116. Otherwise, in step 122, a new entity is selected from the list of entities corresponding to the PGA being processed.

For each entity in a PGA, each signal of that entity is traced one at a time to determine whether it is an external or internal signal. In step 124, if all of the signals for the current entity being processed have already been traced, then the program branches to step 120. Otherwise, the program branches to step 126 which calls a signal boundary tracing subroutine to classify the currently-active signal as either external or internal. When the program returns from this tracing subroutine, it continues with step 124.

Figure 8:
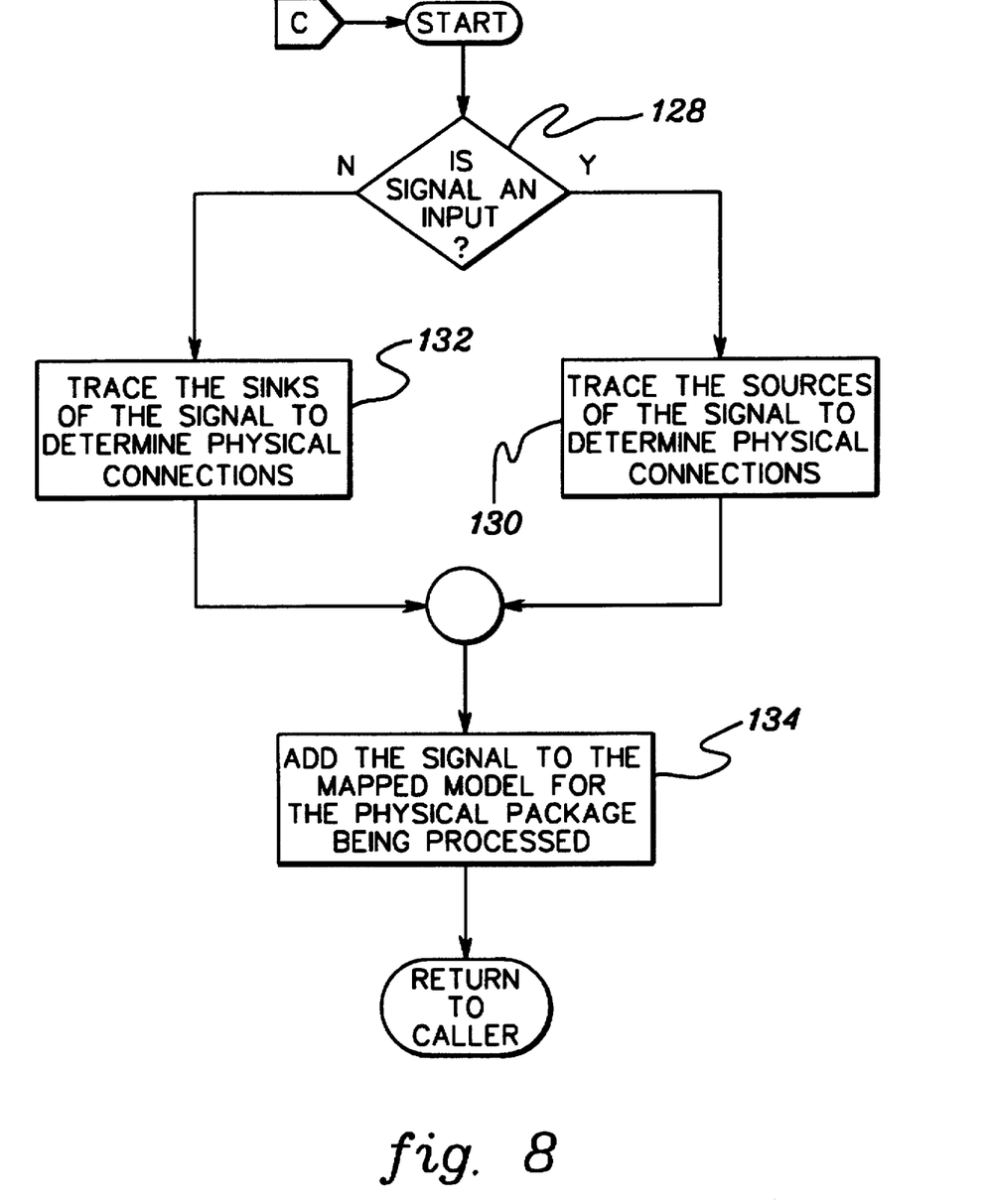
Figure 9A:
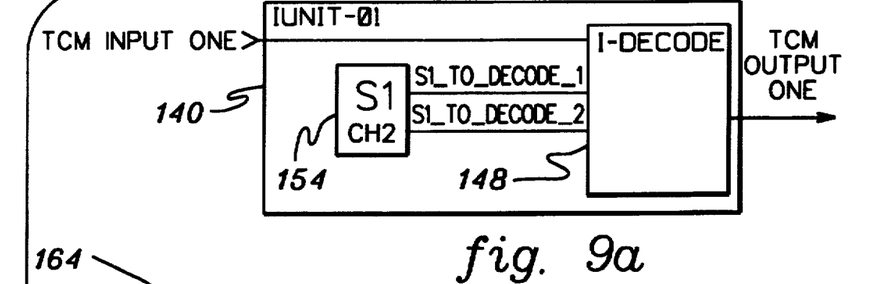
FIG. 9A–9D comprise a graphical representation of a logical hierarchy having a set of partition group assertions designated thereon, and in a different way than in FIG. 3A–3D, in accordance with the present invention.
Figure 9B:
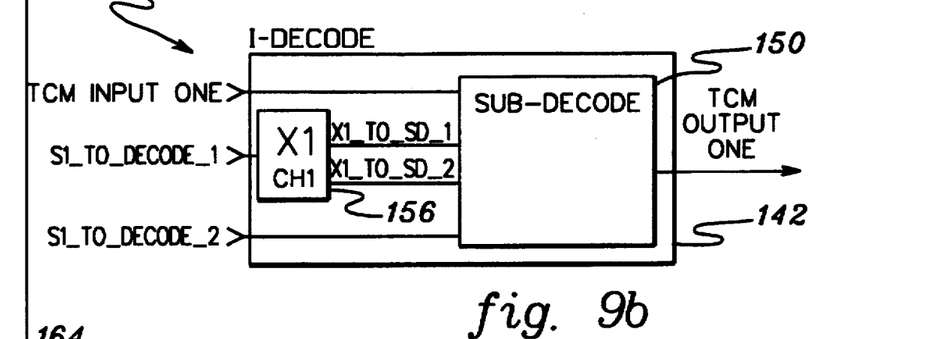
Figure 9C:
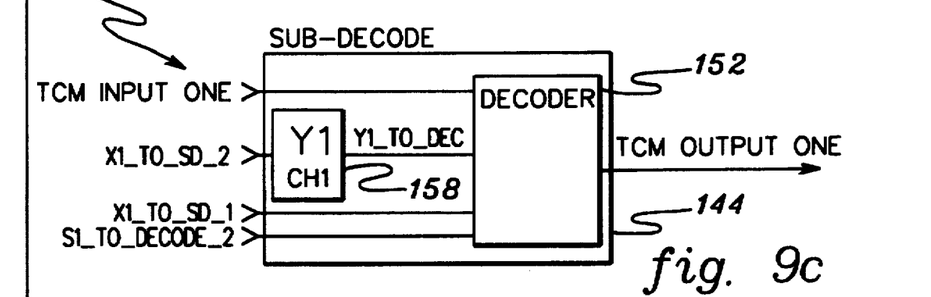
Figure 9D:
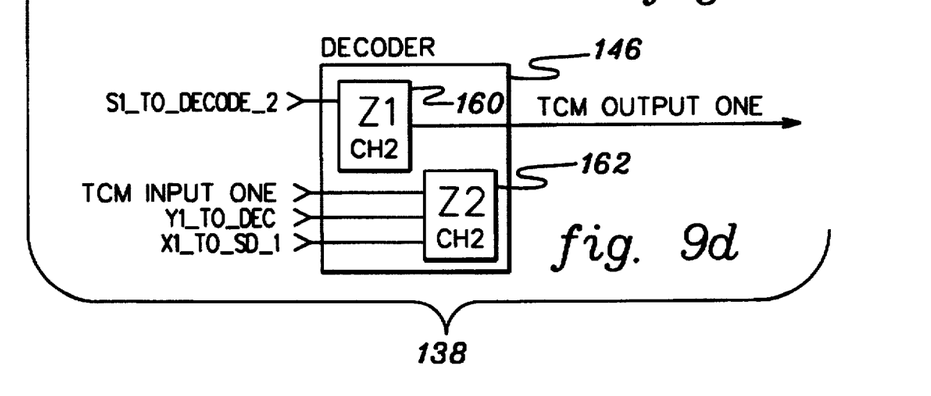

The tracing subroutine called by step 126 is illustrated in FIG. 8. In step 128, a decision is made as to whether the signal currently being processed is an input to or output from the entity currently being processed. If it is an input, then the program branches to step 130. Otherwise, the signal is an output, and the program branches to step 132. In step 130, the sources of the input signal are traced to classify the signal as either external or internal (a source is an entity providing the signal as an output). In making this classification, the lists of entities grouped by common physical package which are stored in memory, are used. Specifically, the entities that act as sources for the input signal are compared with these lists to determine if any one of the sources is located on a different physical package than the physical package containing the entity currently being processed. If so, then the signal is classified as external. However, if all sources of the input signal are located on the same physical package as the physical package for the entity currently being processed, then the signal is classified as internal.

Following step 128, if it was decided that the signal is an output signal, then in step 132 the sinks of the output signal are traced to classify the signal as either external or internal (a sink is an entity using the signal as an input). In making this classification, the lists of entities grouped by common physical package, which are stored in memory, are used. Specifically, the entities that act as sinks of the output signal are compared with these lists to determine if any one of the sinks is located on a different physical package than the physical package containing the entity currently being processed. If so, then the signal is classified as external. However, if all sinks of the output signal are located on the same physical package as the physical package for the entity currently being processed, then the signal is classified as internal.

In step 134, following the tracing of either step 130 or 132, the appropriate classification for the signal currently being processed of either external or internal is added to the physical model being generated by the mapping compiler and is stored in memory. The physical model being generated is stored in memory until the mapping process is completed. This model contains all of the data required to store it in a file format.

Following step 134, the program leaves the tracing subroutine, returns to step 126, and proceeds to step 124 of the physical boundary determination subroutine shown in FIG. 7. As discussed above, when physical boundaries have been determined for all PGAs, as determined by the decision box of step 116, then the program returns to step 110 of the mapping subroutine shown in FIG. 6 and proceeds to step 112.

In step 112, a physical model is generated for each PGA (in other words, each physical package). This model contains a first representation of all logical entities, including their interconnecting external and internal signals, that are located on each physical package and corresponds to the lowest level of the physical hierarchy according to the present invention. This representation is stored in memory, in a preferred approach, in a file format that can be read by a graphics editor to display or edit the physical model. As an example, this first representation corresponds to low level 73 of the physical hierarchy shown in FIG. 4C. The stored first representation for each PGA is used to generate a graphical representation of a physical hierarchy, for example, as shown in FIGS. 4A–4C.

Next, in step 114, models for the higher levels of the physical hierarchy according to the present invention are generated. These models include a second representation indicating the physical packages and physical interconnections thereof for the physical design of the electronic system. The second representation is stored in memory, in a preferred approach, in a file format that can be read by the graphics editor used above. As an example, the second representation corresponds to middle level 72 of the physical hierarchy in FIG. 4B.

Models for higher levels of a physical hierarchy, such as top level 71 in FIG. 4A, are generated by translating the physical model in memory that was generated by the mapper.

In the preferred approach, the above models of the physical hierarchy are stored as a collection of separate files which together form physical hierarchy file 16.

Following the creation of a physical hierarchy according to the present invention, the program leaves the mapping subroutine shown in FIG. 6 and returns to step 104, which initially called the mapping subroutine, of the main program routine shown in FIG. 5. The program proceeds to step 106, and the physical hierarchy file 16 is checked against technology limits and rules file 14. These checks are made to determine whether the physical hierarchy that has been mapped by compiler 10 complies with the physical (i.e. real-world) constraints of the physical packages that have been selected for the physical design of the electronic system. Examples of these constraints include the maximum number of inputs/outputs for a package, the maximum power consumption per package, maximum fanout for each pin on a package, and the maximum number of circuits permissible per package. These constraints can also be applied to higher levels of the physical hierarchy. For example, referring to FIG. 4A, the maximum power consumption for top level 71 could be a constraint in file 14. Many other constraints can be included in technology file 14, as will be recognized by one skilled in the art.

During the creation of logical hierarchy file 12, it is necessary to designate assertions corresponding to physical constraints on the entities therein. These assertions are designated in a manner similar to that for PGAs, are stored with the other data in file 12, and include, for example, assertions such as the following: power consumption of the entity, area or volume estimate required in a physical package to implement the circuitry corresponding to the entity, maximum fanout of an entity, and timing path information. These assertions remain associated with the primitive entities during the mapping process and are incorporated within the final physical hierarchy file 16.

Also, data regarding the physical structure of the physical hierarchy such as the number of physical connections per package, fanout between packages, size of the package, power use, and other technical information are derived during the mapping process and stored in file 16 as physical properties of the hierarchy.

In some cases, where an entity does not have an assertion corresponding to a physical constraint, a default formula may be used to calculate a physical attribute for that entity. For example, if an entity does not have a power consumption assertion designated for it, then a power consumption value may be calculated using the default formula.

In order to determine compliance of the physical hierarchy with the technology constraints, in the preferred embodiment, the physical compliance of each physical package is processed one at a time. Further, within each physical package, each primitive entity is processed one at time. For each primitive entity, physical attributes for that entity, such as its power consumption, may be calculated. Also, as each primitive entity in a package is processed, physical attributes for the package are calculated such as its total power consumption, its total number of input/output pins (i.e. its total number of external signals), or the size of the circuitry represented by the entities thereon.

Following processing of every physical package, the values calculated as described above are compared with the physical constraints in the technology limits and rules file 14. A report summarizing this comparison is generated and stored as technology checking results file 18. Where a physical package's calculated attribute is out of compliance, an error flag is generated for that package and stored in file 18.

Following the generation of technology checking results file 18, which is stored on physical storage device 34, the program ends at step 108.

If a physical hierarchy has been mapped as described above, yet violates at least one technology limit or rule, then a set of PGAs are designated for the logical entities of the logical hierarchy in order to change the mapping of the physical hierarchy. This set of PGAs may correspond to the same or a different set of physical packages. The new physical hierarchy thus generated is compared with the physical limits file to determine compliance. This process is repeated as required to complete the physical design for the electronic system.

In addition to the above, following the mapping of a physical hierarchy, in a preferred approach, additional attributes associated with the physical components of the system such as polarity (e.g. positive or negative) or drive capability (e.g. fast or slow) may be annotated to some of the physical packages in the physical hierarchy. These annotations are often useful in later design steps. During the several mapping iterations typically required to complete the physical partitioning for a system, it is advantageous that these annotated attributes remain associated with the corresponding physical packages when the physical connections to that package do not change during any given remapping.

EFFECT OF A CHANGE IN PGA DESIGNATION

In general, a change in the PGA designation in a logical hierarchy will change the mapping of the physical hierarchy. FIGS. 9A–9D and 10A–10C illustrate the effects of a change in PGA designation. FIGS. 9A–9D comprise a graphical representation of the logical hierarchy of FIGS. 3A –3D in which the PGA designation for just one of the primitive entities therein has been changed, and FIGS. 10A–10C comprise a graphical representation of the physical hierarchy mapped from the logical hierarchy with PGAs designated as shown in FIGS. 9A–9D.

More specifically, FIGS. 9A–9D illustrate a logical hierarchy 138 having blocks 140, 142, 144, and 146, respectively, positioned at different levels in hierarchy 138. Parent entities 148, 150, and 152 and primitive entities 154, 156, 158, 160, and 162 are connected by signals 164. The PGA designations for the primitive entities in FIGS. 9A–9D are the same as shown in FIGS. 3A–3D except that primitive entity 156 in FIG. 9B now has a PGA designation of "CH1" rather than "CH2" as for entity 58 in FIG. 3B. Thus, primitive entities 156 and 158 are designated with a PGA of "CH1", and primitive entities 154,160, and 162 are designated with a PGA of "CH2".

Figures 10A, 10B, 10C:
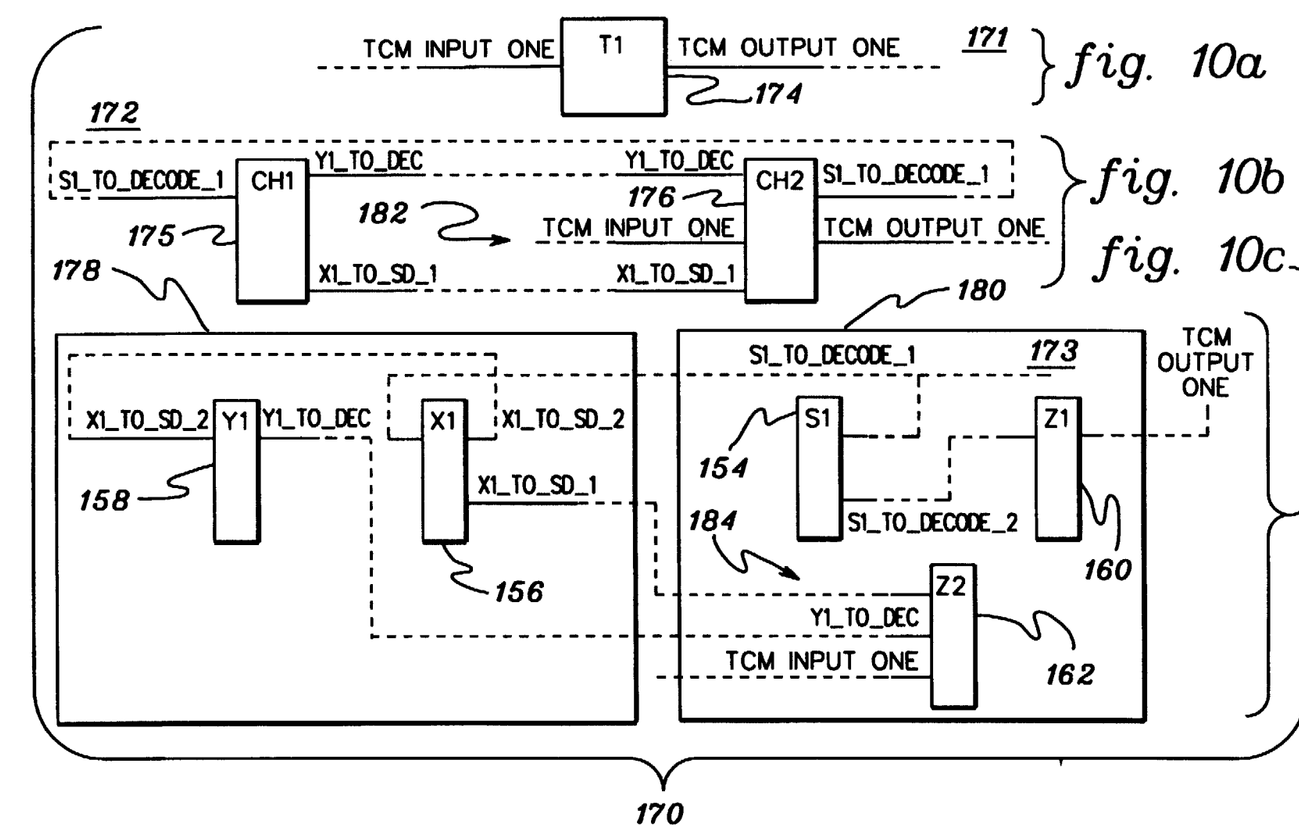
FIG. 10A–10C comprise a graphical representation of a second physical hierarchy mapped from the logical hierarchy of FIG. 9A–9D according to the present invention.

FIGS. 10A–10C illustrate a physical hierarchy 170 mapped from logical hierarchy 138 of FIG. 9A–9D. Physical hierarchy 170 has a top level 171 shown in FIG. 10A, middle level 172 shown in FIG. 10B, and lower level 173 shown in FIG. 10C. A block 174 is on top level 171 and represents physical packages 175 and 176 of middle level 172. A block 178 encloses primitive entities 156 and 158 of lower level 173 and indicates that these two entities are located on physical package 175. Similarly, a block 180 encloses primitive entities 154, 160, and 162 and indicates that these entities are located on physical package 176. Physical packages 175 and 176 are connected by signals 182, and the primitive entities of lower level 173 are connected by signals 184.

The result of the change in PGA designation from FIGS. 3A–3D to FIGS. 9A–9D includes the following: the location in the physical hierarchy for primitive entity 156 changes from chip 2 to chip 1, the classification for signal "X1_TO_SD_1" changes from internal to external, the classification for signal "S1_TO_DECODE_1" changes from internal to external, and the classification for signal "X1_TO_SD_2" changes from external to internal. Because signals "X1_TO_SD_1" and "S1_TO_DECODE_1" now connect entities located on different physical packages, they are external signals and are included in signals 182 on middle level 172.

Although FIGS. 9A–9D and 10A–10C illustrate the effects of a change in PGA designation, the logical hierarchy presented in FIGS. 9A–9D is relatively small compared with hierarchies used in practice for purposes of description. However, when designing a typical electronic system having hundreds of physical components, the computation time required for logical-to-physical mapping is considerable. Therefore, in a preferred approach of the present invention, when changes are made to the logical hierarchy for a system, and then mapped into a physical hierarchy, it is advantageous to implement an incremental capability such that only the portions of the physical hierarchy affected by the changes are re-mapped. Other portions of the physical hierarchy that will be unaffected by the changes are not remapped in order to reduce wasted computations.

An important advantage of the present invention is that changes in the physical design of a system can be accomplished without changing the logical design of the system. Instead, different PGA designations are made for different physical designs. Partitioning the logical design in this manner is relatively easy to perform. Because the logical design is unchanged, the overall design process becomes simpler, faster, and less likely to generate design errors. Specifically, the use of the present invention avoids the introduction of functional problems not previously present.

Another advantage is that the mapping of the physical hierarchy is done automatically. Still another advantage is that the amount of verification simulation required is reduced since the mapping does not contain errors from manual editing.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

For example, in other embodiments according to the present invention, the number of levels in the logical hierarchy or physical hierarchy can vary. Further, the signals connecting entities can be bundled into nets corresponding to multi-bit buses or other similar configurations, as recognized by one skilled in the art, without affecting the practice of the invention. Whether the signals connecting entities or physical packages are bundled or not is not critical to the practice of the invention. Each signal, even though representing a single strand of a multi-bit net or bus, is still traced in substantially the manner described above.

We claim:

1. A method for designing an electronic device using a digital computer wherein a logical hierarchy comprising logical entities interconnected by signals is mapped into a physical hierarchy comprising physical packages, comprising the steps of:

designating partition group assertions for each of said logical entities, each of said partition group assertions corresponding to one of said physical packages;

tracing the signals for each of said logical entities using said computer; and classifying each of said signals as either external or internal responsive to said tracing, said external classification corresponding to a signal connecting logical entities located on different physical packages and said internal classification corresponding to a signal connecting logical entities located on the same physical package.

2. The method according to claim 1 further comprising the step of providing a first representation of the physical interconnections of said physical packages, said physical interconnections corresponding to said external signals.

3. The method according to claim 2 further comprising the step of providing a second representation for each of said physical packages of the logical entities and interconnecting external and internal signals located thereon.

4. The method according to claim 2 further comprising the step of flattening said logical hierarchy into a logical representation consisting of primitive entities.

5. The method according to claim 4 further comprising the step of storing a list for each of said physical packages indicating which of said primitive entities are physically located thereon.

6. The method according to claim 1 wherein said step of designating partition group assertions comprises designating at least one of said assertions by representation through a parent entity.

7. The method according to claim 1 further comprising the steps of:

providing a physical constraints file corresponding to at least one of said physical packages;

determining a physical attribute for at least one of said physical packages and corresponding to said physical hierarchy; and comparing said physical attribute to said physical constraints file.

8. A method for designing an electronic device using a digital computer having a memory wherein a logical hierarchy comprising parent and primitive logical entities interconnected by signals and stored in said memory, said logical hierarchy representing logical functions corresponding to said electronic device, is mapped into a physical hierarchy comprising physical packages and stored in said memory, comprising the steps of:

designating partition group assertions for each of said primitive entities, each of said partition group assertions corresponding to one of said physical packages;

flattening said logical hierarchy into a logical representation consisting of primitive entities;

storing a list in said memory for each of said physical packages indicating which of said primitive entities are physically located thereon;

tracing the signals for each of said primitive entities with said computer using said list for each of said physical packages;

classifying each of said signals as either external or internal responsive to said tracing, said external classification corresponding to a signal connecting primitive entities located on different physical packages and said internal classification corresponding to a signal connecting primitive entities located on the same physical package; and generating said physical hierarchy of said physical packages, said physical hierarchy providing a first representation of the physical interconnections of said physical packages, said physical interconnections corresponding to said external signals, and a second representation for each of said physical packages indicating the primitive entities and interconnecting external and internal signals located thereon.

9. The method according to claim 8 further comprising the steps of:

providing a physical constraints file corresponding to at least one of said physical packages;

determining a physical attribute for at least one of said physical packages and corresponding to said physical hierarchy; and comparing said physical attribute to said physical constraints file.

10. The method according to claim 9 wherein said step of determining a physical attribute comprises determining a physical attribute corresponding to said first representation.

11. The method according to claim 9 wherein said step of determining a physical attribute comprises determining a physical attribute corresponding to said second representation.

12. The method according to claim 9 further comprising the step of generating a compliance report for at least one of said physical packages in response to said step of comparing.

13. The method according to claim 8 wherein said step of designating partition group assertions comprises designating partition group assertions using an interactive graphics terminal.

14. The method according to claim 8 wherein said step of designating partition group assertions comprises designating a partition group assertion for at least one of said primitive entities by representation through a parent entity thereof.

15. The method according to claim 8 wherein said first representation comprises a graphical representation.

16. The method according to claim 8 wherein said second representation comprises a graphical representation.

17. A digital computer for designing an electrical device, said computer having a central processing unit, a memory, and an input/output system, comprising:

first storage means for storing a logical hierarchy comprising logical entities interconnected by signals;

second storage means for storing a physical hierarchy comprising physical packages and physical interconnections therebetween;

means for designating partition group assertions for each of said logical entities, each of said partition group assertions corresponding to one of said physical packages;

means for tracing the signals for each of said logical entities; and means for classifying each of said signals as either external or internal responsive to said tracing, said external classification corresponding to a signal connecting logical entities located on different physical packages and said internal classification corresponding to a signal connecting logical entities located on the same physical package.

18. The computer of claim 17 further comprising means for providing a first representation of the physical interconnections of said physical packages, said physical interconnections corresponding to said external signals, and a second representation for each of said physical packages indicating the primitive entities and interconnecting external and internal signals located thereon.

19. The computer of claim 18 further comprising means for flattening said logical hierarchy into a logical representation consisting of primitive entities.

20. The computer of claim 18 wherein said means for designating partition group assertions comprises means for designating at least one of said assertions by representation through a parent entity.

21. The computer of claim 17 further comprising:

third storage means for storing a physical constraints file corresponding to at least one of said physical packages;

means for determining a physical attribute for at least one of said physical packages and corresponding to said physical hierarchy; and means for comparing said physical attribute to said physical constraints file.

* * * * *